(12) United States Patent
Lee et al.

(10) Patent No.: US 8,114,715 B2
(45) Date of Patent: Feb. 14, 2012

(54) RESISTIVE RANDOM ACCESS MEMORY AND METHOD FOR MANUFACTURING THE SAME

(75) Inventors: Ming-Daou Lee, Chiayi (TW); Chia-Hua Ho, Hsinchu (TW); Erh-Kun Lai, Taichung (TW); Kuang-Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/654,810

(22) Filed: Jan. 5, 2010

(65) Prior Publication Data

US 2010/0112810 A1  May 6, 2010

Related U.S. Application Data

(62) Division of application No. 11/898,529, filed on Sep. 13, 2007, now Pat. No. 7,667,293.

(51) Int. Cl.
*H01L 21/82* (2006.01)

(52) U.S. Cl. ........................................ 438/128; 438/48
(58) Field of Classification Search .................. 438/128, 438/48
See application file for complete search history.

(56) References Cited

U.S. PATENT DOCUMENTS

| | | | |
|---|---|---|---|
| 6,483,999 B1 | 11/2002 | Andersen et al. | |
| 6,783,999 B1 | 8/2004 | Lee | |
| 7,504,653 B2 | 3/2009 | Lung | |
| 7,601,995 B2 * | 10/2009 | Happ et al. | 257/213 |
| 2006/0006374 A1 | 1/2006 | Chang | |
| 2006/0215445 A1 | 9/2006 | Baek et al. | |

* cited by examiner

*Primary Examiner* — Douglas Menz
(74) *Attorney, Agent, or Firm* — Bacon & Thomas, PLLC

(57) ABSTRACT

A resistive random access memory including, an insulating layer, a hard mask layer, a bottom electrode, a memory cell and a top electrode is provided. The insulating layer is disposed on the bottom electrode. The insulating layer has a contact hole having a first width. The hard mask layer has an opening. A portion of the memory cell is exposed from the opening and has a second width smaller than the first width. The top electrode is disposed on the insulating layer and is coupled with the memory cell.

13 Claims, 12 Drawing Sheets

RESISTIVE RANDOM ACCESS MEMORY AND METHOD FOR MANUFACTURING THE SAME

This application is a divisional application of co-pending U.S. application Ser. No. 11/898,529, filed Sep. 13, 2007.

BACKGROUND OF THE INVENTION

1. Field of the Invention

The invention relates in general to a resistive random access memory and method for manufacturing the same, and more particularly to a resistive random access memory and a method for manufacturing the same capable of reducing the width of the memory cell without a mask and increasing resistance.

2. Description of the Related Art

Along with the advance in semi-conductor technology, electronic elements are kept being miniaturized, such that electronic products possess more and more functions when the size remains unchanged or become even smaller. As there are more and more information to be processed, the demand for the memory having larger capacity but smaller size is ever increasing.

Currently, the read-write memory stores data by means of a transistor structure assisted by a memory cell. However, the technology for manufacturing such memory has come to a bottleneck in terms of scalability. Therefore, more advanced memory structures, such as phase change random access memory (PCRAM), magnetic random access memory (MRAM), and resistive random access memory (RRAM), are presented. The RRAM, having the advantages of fast read-write speed, non-destructive access, tolerance against extreme temperatures and compatibility with current manufacturing process of complementary metal oxide semiconductor (CMOS), is a new memory technology with great potential to replace the current storage media.

Currently, RRAM still has much to improve in mass production, needs to tackle with the problems of leakage current and high power consumption, and still has to overcome many other problems before commercial application matures.

SUMMARY OF THE INVENTION

The invention is directed to a resistive random access memory and a method for manufacturing the same. The memory cell manufactured according to the manufacturing method of the invention without using the mask manufacturing process can break the limit of the lithography technology, hence increasing resistance and reducing power consumption.

According to a first aspect of the present invention, a resistive random access memory including an insulating layer of a bottom electrode, a hard mask layer, a memory cell and a top electrode is provided. The bottom electrode is disposed on the substrate. The insulating layer is disposed on the bottom electrode. The insulating layer has a contact hole having a first width. The hard mask layer has an opening. A portion of the memory cell exposed from the opening has a second width smaller than the first width. The top electrode is disposed on the insulating layer and is coupled with the memory cell.

According to a second aspect of the present invention, the manufacturing method of resistive random access memory includes the following steps. First, a bottom electrode is formed. Next, an insulating layer is formed on the bottom electrode, wherein the insulating layer has a contact hole having a first width. Then, a spacer having a first opening is formed in the contact hole, wherein the first opening has a second width smaller than first width. Next, a memory cell having a second width is formed. Then, a top electrode coupled with the memory cell is formed.

The invention will become apparent from the following detailed description of the preferred but non-limiting embodiments. The following description is made with reference to the accompanying drawings.

DETAILED DESCRIPTION OF THE INVENTION

First Embodiment

Figure 1A:
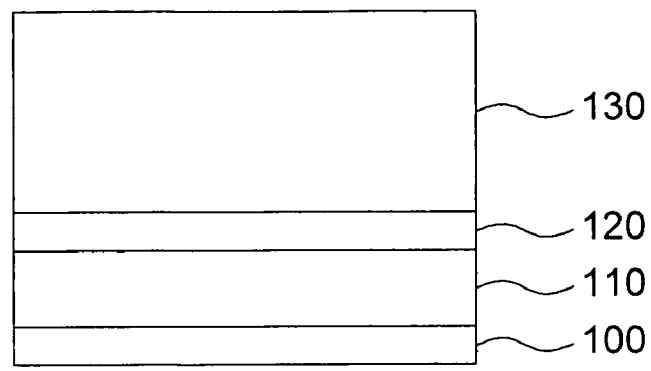
FIGS. 1A-1G are schemes showing the manufacturing process of a resistive random access memory according to a first embodiment of the invention.

Referring to FIGS. 1A-1G, schemes showing the manufacturing process of a resistive random access memory according to a first embodiment of the invention are shown. Also referring to FIG. 2, a flowchart of the manufacturing process of a resistive random access memory according to the first embodiment of the invention is shown. Referring to FIG. 1A, first, the manufacturing process begins at step 201, a bottom electrode 110 is formed on a substrate 100, wherein the substrate 100 is a silicon wafer for example, and the bottom electrode 110 is made of aluminum-copper alloy or tungsten. Next, the manufacturing process proceeds to step 202, a nitride layer 120 is formed on the bottom electrode 110, wherein the nitride layer 120 is exemplified by silicon nitride in the present embodiment of the invention. Then, the manufacturing process proceeds to step 203, an insulating layer 130 is formed on the nitride layer 120. In the present step, silicon oxide or tetraethoxysilan (TEOS) is deposited via plasma enhanced chemical vapor deposition (PECVD), or silicon oxide is deposited according to low pressure chemical vapor deposition (LPCVD). Preferably, after the insulating layer 130 is deposited, the insulating layer 130 is planarized according to chemical mechanical polishing (CMP) method.

Figure 1B:
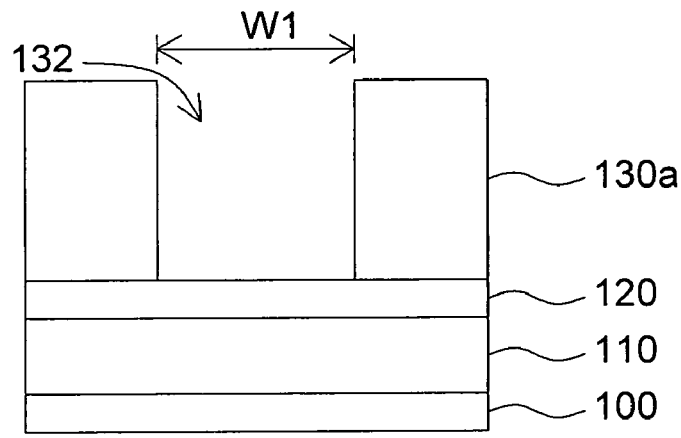
Figure 2:
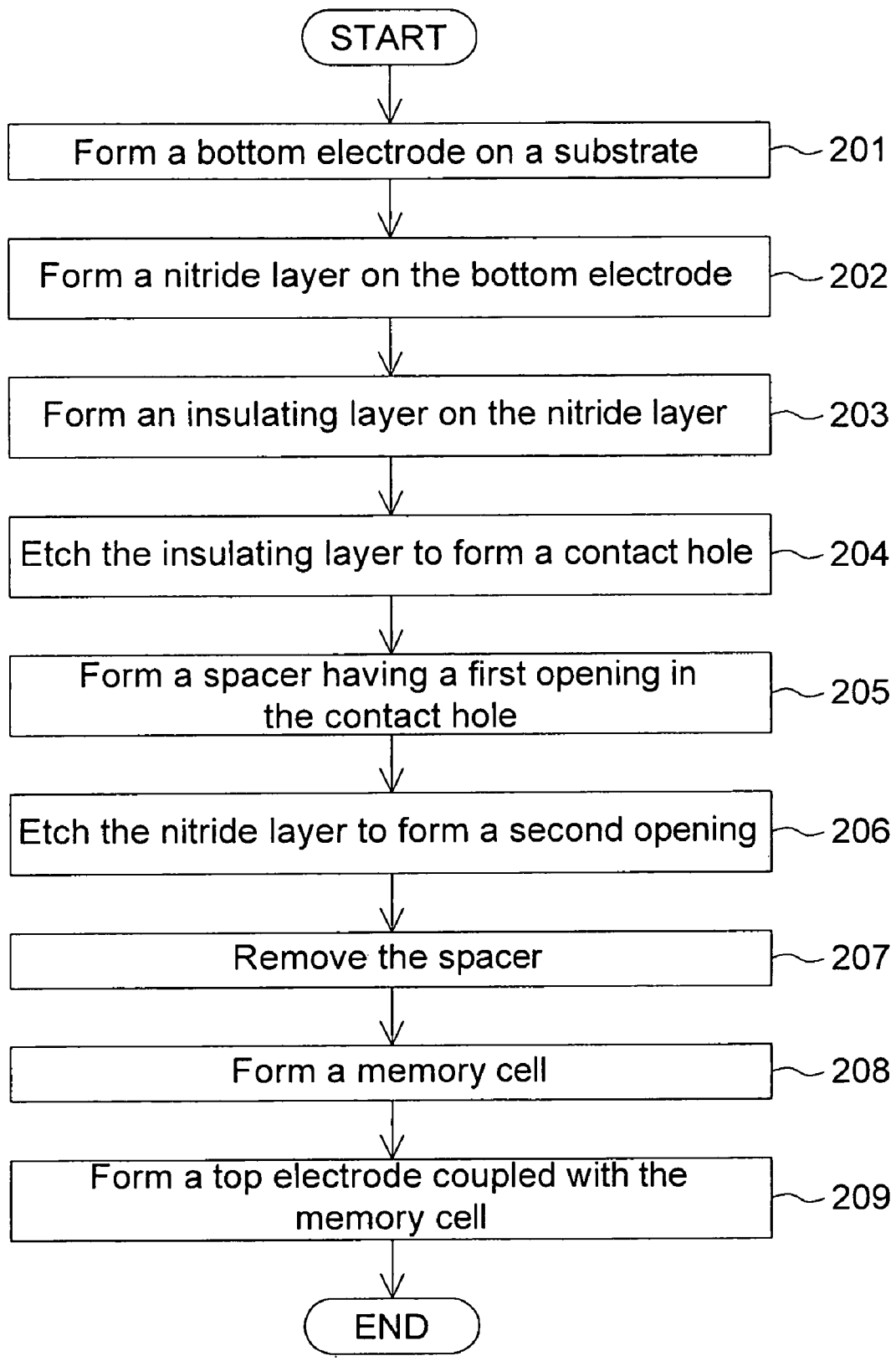
FIG. 2 is a flowchart of the manufacturing process of a resistive random access memory according to the first embodiment of the invention.

Referring to FIG. 1B, as indicated in step 204, the insulating layer 130 is etched as an insulating layer 130a to form a contact hole 132 having a width W1. The present step can use a mask manufacturing process assisted by reactive ion etching (RIE) method to form the contact hole 132. The nitride layer 120 is used as an etching stopper layer herein, and is also an excellent anti-oxidation barrier material used in the following process.

Figure 1C:
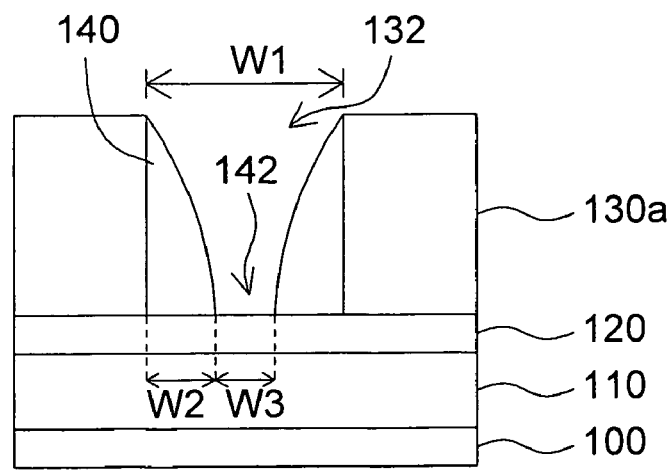

Referring to FIG. 1C, as indicated in step 205. First, the spacer material layer (not illustrated) is deposited, wherein the spacer material layer is made of silicon oxide. In the present step, the spacer material layer is formed by way of thermal evaporation, e-beam evaporation, or molecular beam epitaxy (MBE) system. Next, the spacer is etched to form a spacer 140 in contact hole 132, wherein the spacer 140 has an opening 142 on the bottom. The spacer material layer can be etched via RIE method. The opening 142 has a width W3 smaller than the width W1 of the contact hole 132, wherein the width W3 is approximately equal to 100 nm. The width W2 of the spacer 140 ranges between 60-100 nm, and is substantially equal to the deposited thickness of the spacer material layer. The etching step is achieved by way of reactive ion etching (RIE) method assisted by F-based chemistries such as $CF_4$, $C_4F_8$, $CHF_3$ and $CH_3F$.

Figure 1D:
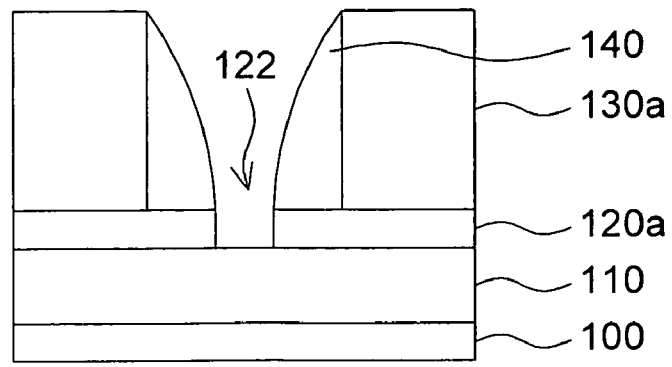

Referring to FIG. 1D, as indicated in step 206, the nitride layer 120 exposed from the opening 142 is etched to form a nitride layer 120a having an opening 122. Likewise, the opening 120a substantially has a width W3.

Figure 1E:
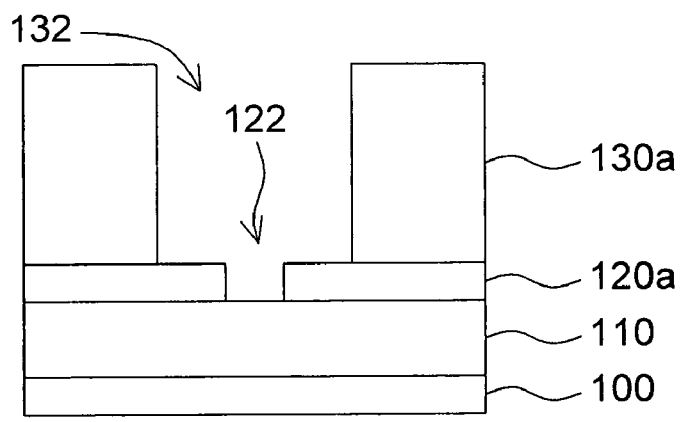

Referring to FIG. 1E, as indicated in step 207, the spacer 140 is removed so that the infilling material is able to enter into the contact hole 132.

Figure 1F:
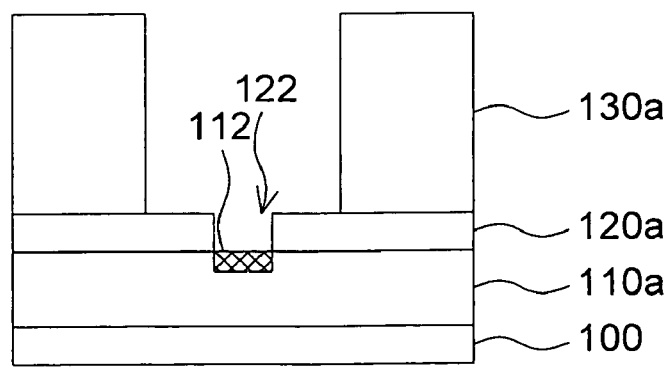

Referring to FIG. 1F, as indicated in step 208, the bottom electrode 110 is oxidized as a bottom electrode 110a so as to form the memory cell 112. As the nitride layer 120a is a hard mask layer and can be used as an excellent anti-oxidation barrier, such that the memory cell 112 formed by way of oxidation is positioned within the part exposed by the opening 122 and has a width W3, and the unexposed part of bottom electrode 110 is protected from oxidizing. In the present step, the temperature is controlled to be between 200° C.-300° C. by a furnace or rapid thermal processing (RTP) system, and the pressure is controlled to be within the range of several mtorr to 1 atm for minutes or hours under a mixed gas environment of oxygen and nitrogen.

Or, the surface of the bottom electrode 110 is oxidized by plasma under a mixed gas environment of pure oxygen ($O_2$), oxygen and argon mixture ($O_2$/Ar), or argon, oxygen and nitrogen mixture (Ar/$O_2$/$N_2$), the pressure is controlled to be within the range of 1 mtorr to 100 mtorrs, and the temperature is controlled to be between the room temperature and 300° C.

Figure 1G:
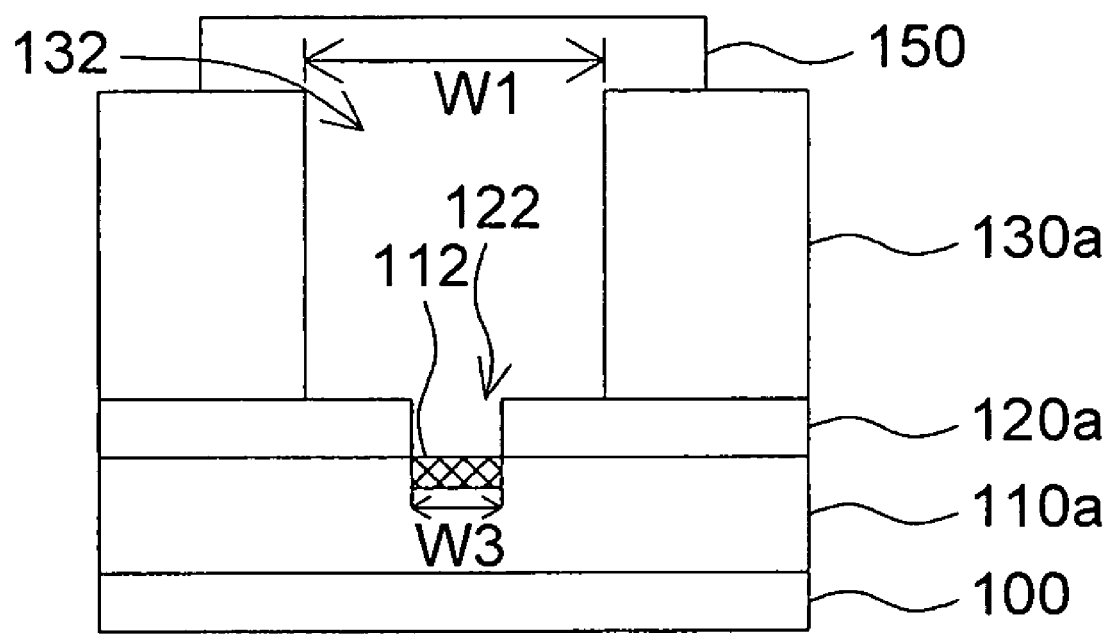

Referring to FIG. 1G, as indicated in step 209, a top electrode 150 coupled with the memory cell 112 is formed, and a resistive random access memory 10 is completed. The resistive random access memory 10 comprises the substrate 100, the bottom electrode 110a, the nitride layer 120a, the insulating layer 130a, the memory cell 112 and the top electrode 150. The bottom electrode 110a is disposed on the substrate 100, the nitride layer 120a is disposed between the bottom electrode 110a and the insulating layer 130a. The memory cell 112 exposed from the opening 122 has a width W3 smaller than the width W1, and is positioned inside the bottom electrode 110a. The insulating layer 130a is disposed on the nitride layer 120a and has the contact hole 132 having the width W1. The top electrode 150 is disposed on the insulating layer 130a and is coupled with the memory cell 112.

The top electrode 150 and the bottom electrode 110a can only be coupled through the memory cell 112, such that the memory cell 112 manufactured according to the manufacturing method of the present embodiment of the invention reduces the area of the memory cell 112 without using an additional mask, but increases the resistance between the top electrode 150 and the bottom electrode 110a. Therefore, less current is generated under the same operating voltage, not only reducing the overall power consumption but also reducing the damage incurring to the memory cell, hence increasing the reliability of overall device. Furthermore, the threshold voltage required for changing the bit state of the memory cell 112 can be reduced to be around 3.4V, further increasing the availability of the resistive memory.

Second Embodiment

Figure 3A:
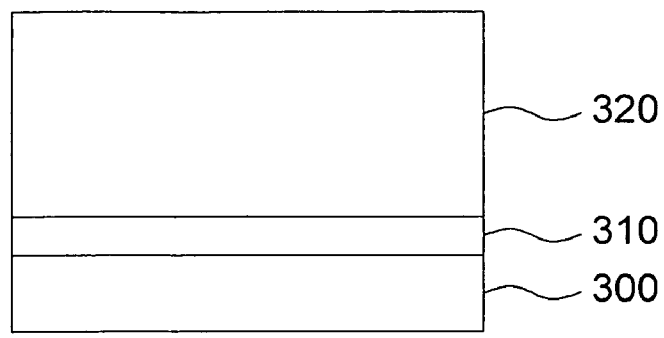
FIGS. 3A-3H are schemes showing the manufacturing process of a resistive random access memory according to a second embodiment of the invention.

Referring to FIGS. 3A-3H, schemes showing the manufacturing process of a resistive random access memory according to a second embodiment of the invention are shown. Also referring to FIG. 4, a flowchart of the manufacturing process of the resistive random access memory according to a second embodiment of the invention is shown. The steps and element characteristics of the present embodiment of the invention common to that of the first embodiment are not repeated here. Referring to FIG. 3A, the manufacturing process begins at step 401, first, a bottom electrode 310 is formed on the substrate 300. Next, the manufacturing process proceeds to step 402, an insulating layer 320 is formed on the bottom electrode 310.

Figure 3B:
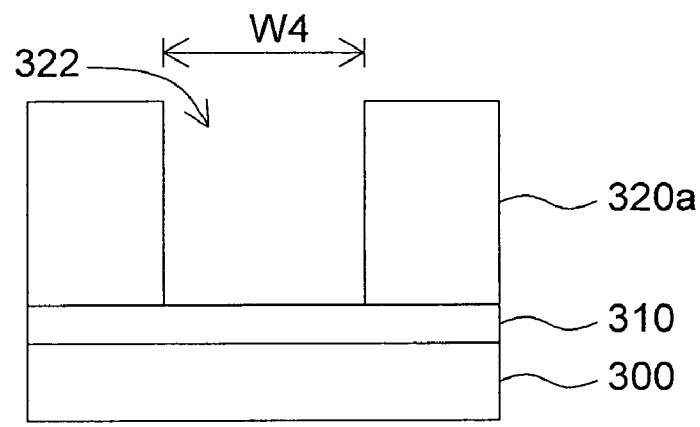
Figure 4:
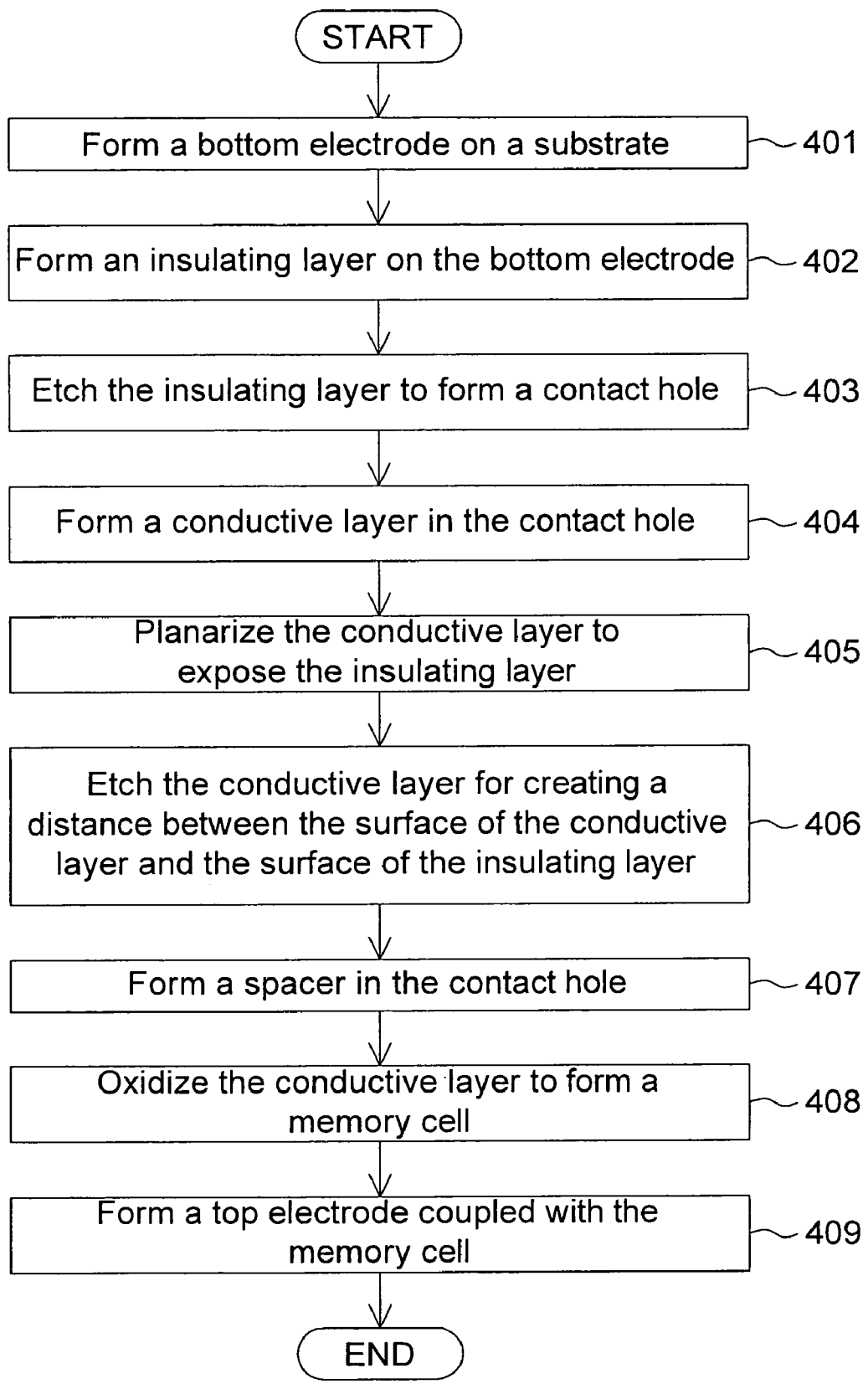
FIG. 4 is a flowchart of the manufacturing process of a resistive random access memory according to the second embodiment of the invention.

Referring to FIG. 3B, as indicated in step 403, the insulating layer 320 is etched as an insulating layer 320a so as to form a contact hole 322 having a width W4.

Figure 3C:
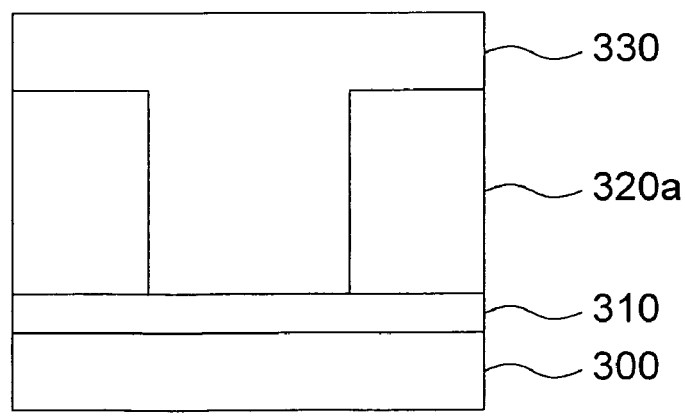

Referring to FIG. 3C, as indicated in step 404, a conductive layer 330 is formed in the contact hole 322. In the present embodiment of the invention, the conductive layer 330 is made of tungsten.

Figure 3D:
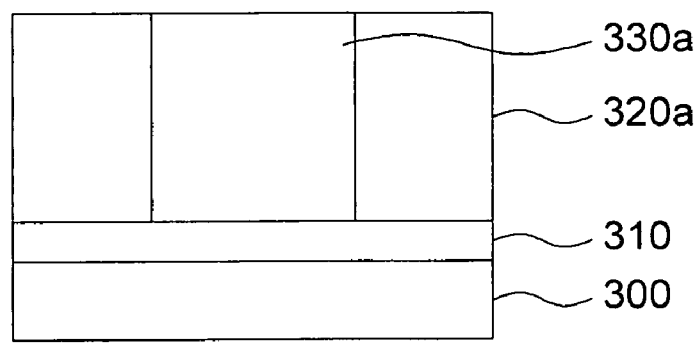

Referring to FIG. 3D, as indicated in step 405, the conductive layer 330 is planarized as a conductive layer 330a. The present step is achieved by way of CMP.

Figure 3E:
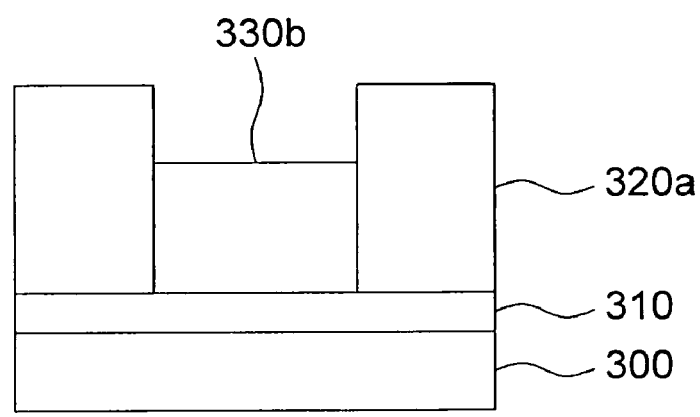

Referring to FIG. 3E, as indicated in step 406, the conductive layer 330a is etched for creating a distance between the surface of the conductive layer 330b and the surface of the insulating layer 320a.

Figure 3F:
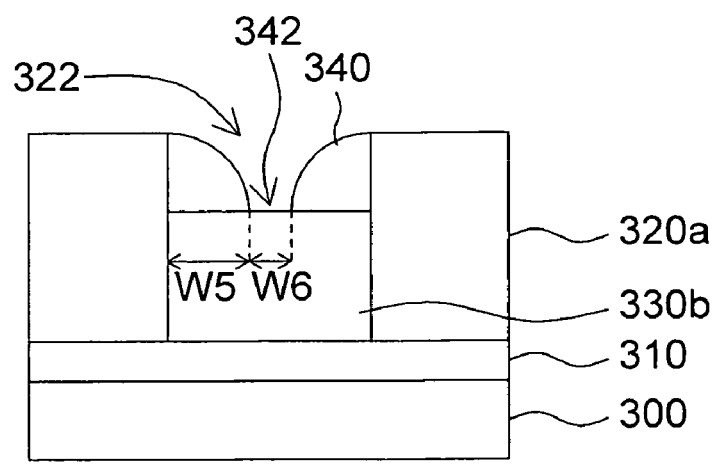

Referring to FIG. 3F, as indicated in step 407, a spacer 340 is formed in the contact hole 322, wherein the spacer 340 has an opening 342 having a width W6 smaller than the width W4. The width W5 is distant from the inner edge of bottom of the spacer 340 to the insulating layer 320a. The width ranges between 60-100 nm and is substantially equal to the deposited thickness of the spacer material layer. In the present embodiment, the material of the spacer 340 is silicon oxide.

Figure 3G:
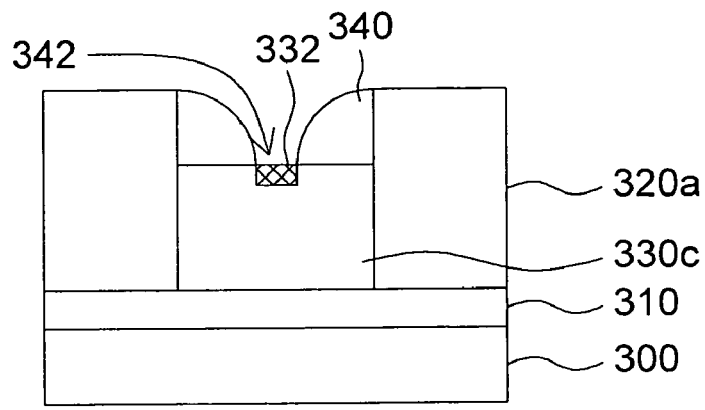

Referring to FIG. 3G, as indicated in step 408, the conductive layer 330b is oxidized as a conductive layer 330c so as to form the memory cell 332. Referring to FIG. 3I, a plan view of the semiproduct of resistive random access memory of FIG. 3G is shown. As shown in FIG. 3I, the spacer 340 positioned inside the contact hole 322 has an opening 342 for exposing the memory cell 332.

Figure 3H:
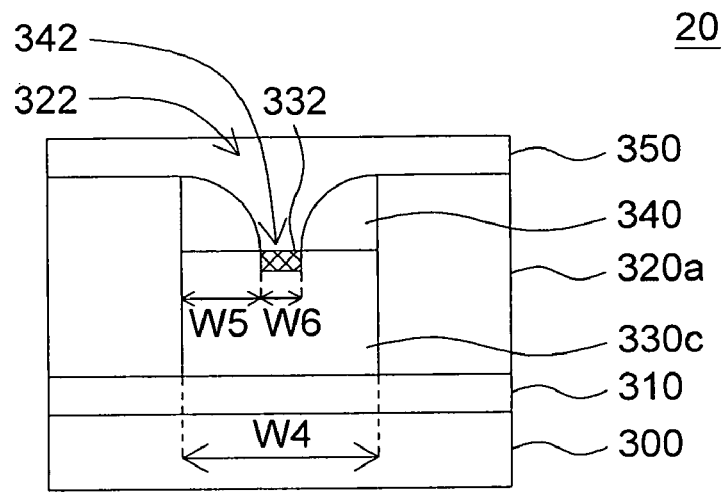
Figure 3I:
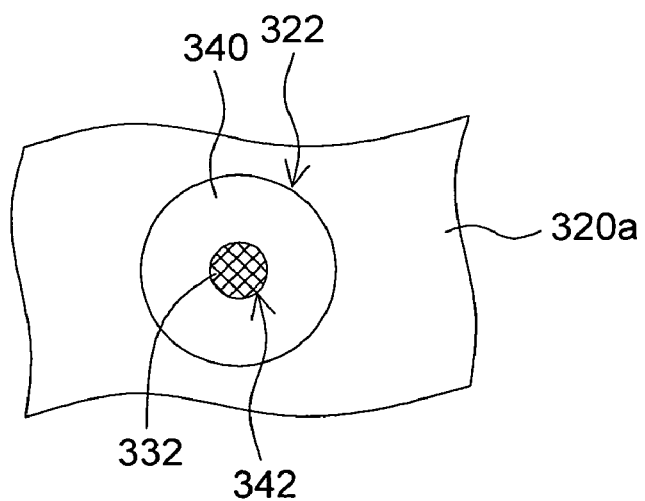
FIG. 3I is a plan view of the semiproduct of resistive random access memory of FIG. 3G.

Referring to FIG. 3H, as indicated in step 409, the top electrode 350 coupled with the memory cell 332 is formed. Up to now, the resistive random access memory 20 is completed. The resistive random access memory 20 includes the substrate 300, the bottom electrode 310, the insulating layer 320a, the conductive layer 330c, the memory cell 332, the spacer 340 and the top electrode 350. The bottom electrode 310 is disposed on the substrate 300. The insulating layer 320a is disposed on the bottom electrode 310. The insulating layer 320a has a contact hole 322 having a width W4. The conductive layer 330c is disposed in the contact hole 322. A hard mask layer exemplified by spacer 340 is disposed above the bottom electrode 310, that is, on the conductive layer 330c. The memory cell 332 positioned on the conductive layer 330c is exposed from the contact hole 322. The spacer 340 is disposed in the contact hole 322 and has an opening 342 having a width W6 smaller than width W4. A portion of the memory cell 332 exposed from the opening 342 has a width W6. The width of the opening 342 is substantially equal to the width of the memory cell 332. The top electrode 350 is disposed on the insulating layer 320a and is coupled with the memory cell 332.

Figure 5:
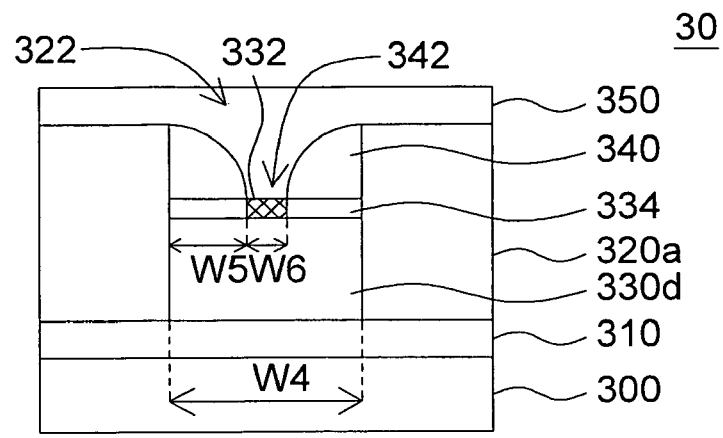
FIG. 5 is a scheme of another resistive random access memory according to a second embodiment of the invention.

Referring to FIG. 5, a scheme of another resistive random access memory according to the second embodiment of the invention is shown. The resistive random access memory 30 differs with the resistive random access memory 20 in that the resistive random access memory 30 has an oxide layer 334 disposed on the conductive layer 330d and the memory cell 332 is a portion of the oxide layer 334. The manufacturing process of the resistive random access memory 30 differs with that of resistive random. access memory 20 in that after the step 406 is performed, the step 408 is performed before the step 407. That is, the conductive layer 330b is oxidized as a conductive layer 330d to form the oxide layer 334 first, and the spacer 340 is formed in the contact hole 322 afterwards. Thus, the top. electrode 350 and the bottom electrode 310 can only be coupled through the memory cell 332 having width W6, such that the resistance is increased.

Third Embodiment

Referring to FIGS. 6A-6E, schemes showing the manufacturing process of a resistive random access memory according to a third embodiment of the invention are shown. Also referring to FIG. 7, a flowchart of the manufacturing process of a resistive random access memory according to the third embodiment of the invention is shown. The steps and element characteristics of the present embodiment of the invention common to that of the first embodiment or the second embodiment are not repeated here.

Figure 6A:
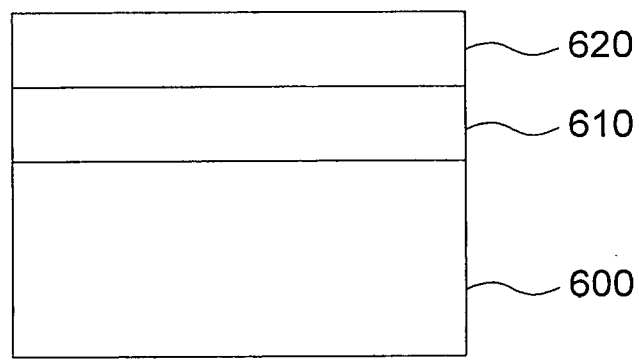
FIGS. 6A-6E are schemes showing the manufacturing process of a resistive random access memory according to a third embodiment of the invention.
Figure 7:
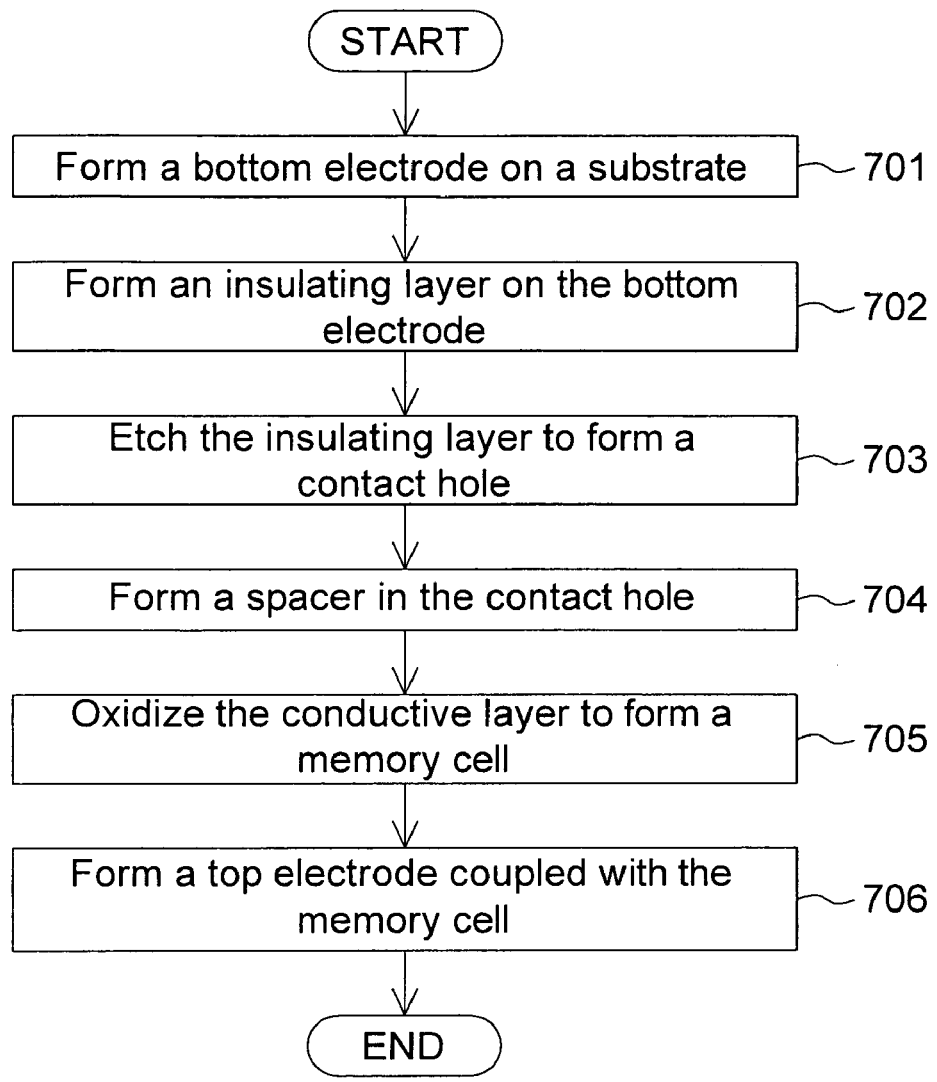
FIG. 7 is a flowchart of the manufacturing process of a resistive random access memory according to a third embodiment of the invention.

Referring to FIG. 6A, the manufacturing process begins at step 701, first, a bottom electrode 610 is formed on the substrate 600, and this bottom electrode 610 is made of tungsten. Next, the manufacturing process proceeds to step 702, an insulating layer 620 is formed on the bottom electrode 610.

Figure 6B:
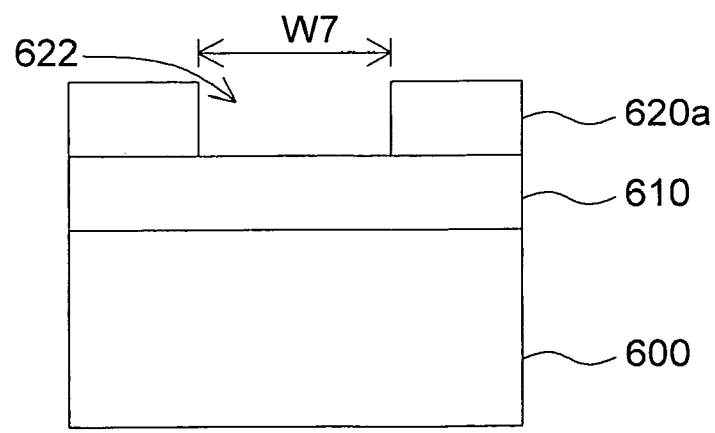

Referring to FIG. 6B, as indicated in step 703, the insulating layer 620 is etched as an insulating layer 620a so as to form a contact hole 622 having a width W7.

Figure 6C:
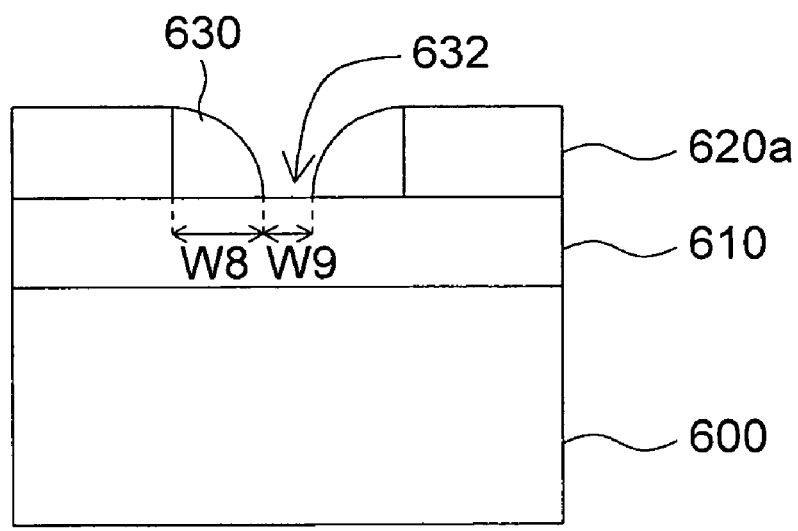

Referring to FIG. 6C, as indicated in step 704, a spacer 630 having an opening 632 is formed, wherein the opening has a width W9 smaller than the width W7. Likewise, the width W8 is distant from the inner edge of the spacer 630 to the insulating layer 620a. The width W8 ranges between 60-100 nm and is substantially equal to the deposited thickness of the spacer material layer. In the present embodiment, the material of the spacer is silicon oxide.

Figure 6D:
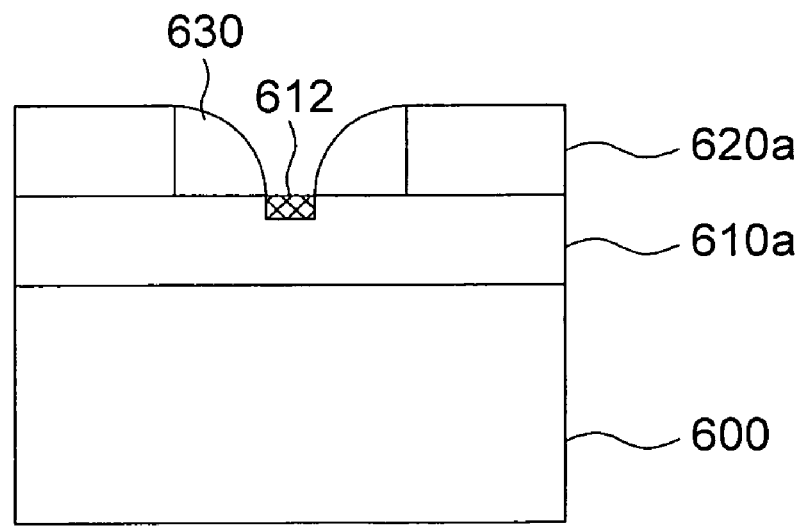

Referring to FIG. 6D, as indicated in step 705, the bottom electrode 610 is oxidized as a bottom electrode 610a so as to form the memory cell 612. Referring to FIG. 6F, a plan view of the semiproduct of resistive random access memory of FIG. 6D is shown. As shown in FIG. 6F, the spacer 630 positioned inside the contact hole 622 has an opening 632 for exposing the memory cell 612.

Figure 6E:
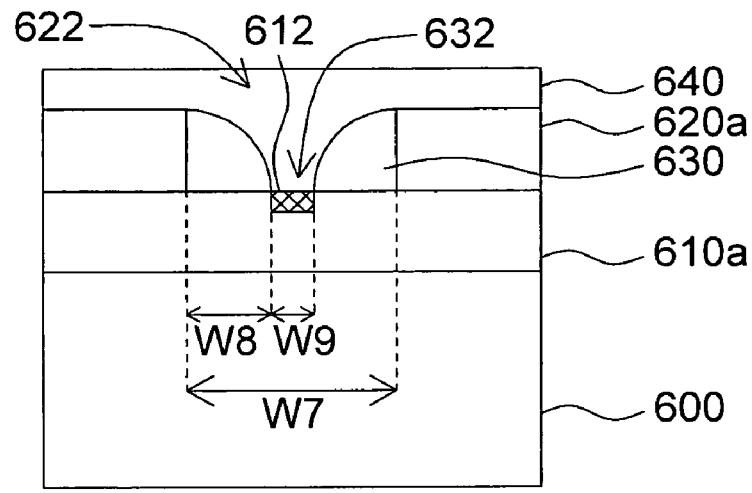
Figure 6F:
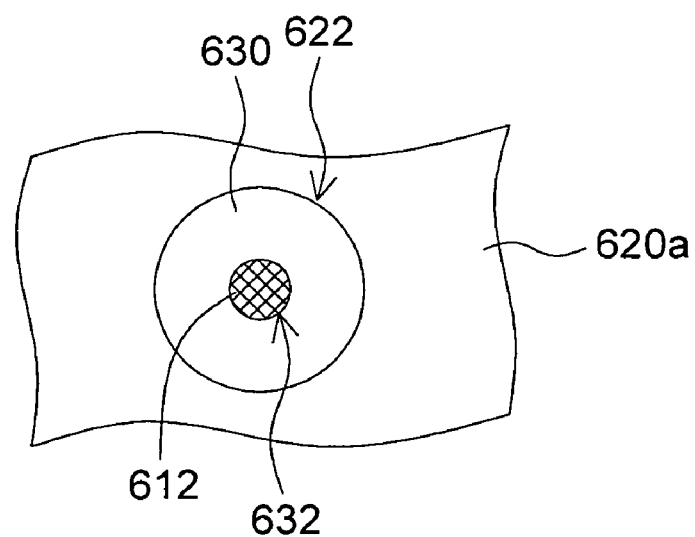
FIG. 6F is a plan view of the semiproduct of resistive random access memory of FIG. 6D.

Referring to FIG. 6E, as indicated in step 706, the top electrode 640 coupled with the memory cell 612 is formed to complete the resistive random access memory 40. The resistive random access memory 40 includes a substrate 600, a bottom electrode 610a, an insulating layer 620a, a spacer 630, a memory cell 612 and a top electrode 640. The bottom electrode 610a is disposed on the substrate 600. The insulating layer 620a is disposed on the bottom electrode 610a. The insulating layer 620a has a contact hole 622 having a width W9. The memory cell 612 is exposed from the contact hole 622. A hard mask layer exemplified by the spacer 630 is disposed on the bottom electrode 610a. The spacer 630 is disposed in the contact hole 622 and has an opening 632 having a width W9. The width of the opening 632 and the width of the exposed portion of the memory cell 612 are substantially the same, and the width W9 is smaller than the width W7. The top electrode 640 is disposed on the insulating layer 620a and is coupled with the memory cell 612. In the present embodiment of the invention, the memory cell 612 is positioned on the bottom electrode 610a preferably made of tungsten.

Figure 8:
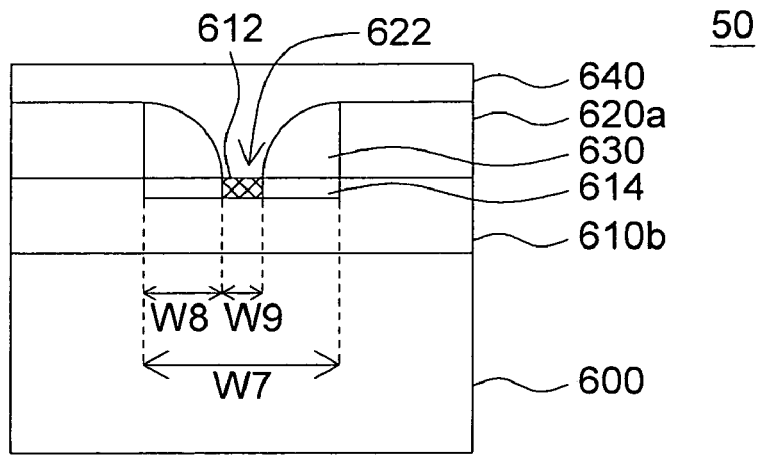
FIG. 8 is a scheme of another resistive random access memory according to a third embodiment of the invention.

Referring to FIG. 8, a scheme of another resistive random access memory according to the third embodiment of the invention is shown. The resistive random access memory 50 differs with the resistive random access memory 40 in that the resistive random access memory 50 further includes an oxide layer 614 disposed on the bottom electrode 610b, and the memory cell 612 is a portion of the oxide layer 614. The manufacturing process of the resistive random access memory 50 differs with that of the resistive random access memory 40 in that after the step 703 is performed, the step 705 is performed before the step 704. That is, after the contact hole 622 is formed first, the bottom electrode 610 is oxidized as a bottom electrode 610b so as to form the oxide layer 614 afterwards. Then, a spacer 630 is formed in the contact hole 622. Thus, the top electrode 640 and the bottom electrode 610b can only be coupled through the memory cell 612 having width W9, such that the resistance is increased.

According to the resistive random access memory and method for manufacturing the same disclosed in the above embodiments of the invention, forming the hard mask together with dry ehcting replaces the mask process, hence breaking through the resolution restriction of the exposing machine to form a small-sized memory cell. The resistive random access memory manufactured via the method of the invention increases resistance and possesses the characteristics of low power consumption and low threshold voltage, hence increasing the practicality and application of the resistive random access memory.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of resistive random access memory, comprising:
    (a) forming an insulating layer, wherein the insulating layer has a contact hole having a first width;
    (b) forming a spacer in the contact hole, wherein the spacer has a first opening having a second width smaller than the first width;
    (c) forming a memory cell having the second width positioned beneath the spacer; and
    (d) forming a top electrode coupled with the memory cell.

2. The manufacturing method according to claim 1, further comprising forming an anti-oxidation barrier material, wherein the insulating layer is formed on the anti-oxidation barrier material.

3. The manufacturing method according to claim 2, further comprising etching the anti-oxidation barrier material so as to form an anti-oxidation barrier having a second opening, wherein the second opening has the second width.

4. The manufacturing method according to claim 1, wherein between step (a) and step (b), the method further comprises
   forming a conductive layer in the contact hole;
   planarizing the conductive layer to expose the insulating layer; and
   etching the conductive layer for creating a distance between the surface of the conductive layer and the surface of the insulating layer.

5. The manufacturing method according to claim 4 further comprising oxidizing the conductive layer prior to step (b).

6. The manufacturing method according to claim 4, wherein the step (d) further comprises oxidizing the conductive layer.

7. The manufacturing method according to claim 1, further comprising forming a bottom electrode, wherein the insulating layer is formed on.

8. The manufacturing method according to claim 7, further comprising oxidizing the bottom electrode prior to the step (b).

9. The manufacturing method according to claim 7, wherein the step (c) further comprises oxidizing the bottom electrode so as to form an oxide layer having the memory cell positioned therein.

10. A manufacturing method of resistive random access memory, comprising:

(a) forming an insulating layer, wherein the insulating layer has a contact hole having a first width;
(b) forming a spacer in the contact hole, wherein the spacer has a first opening having a second width smaller than the first width;
(c) forming a memory cell having the second width; and
(d) forming a top electrode coupled with the memory cell;
wherein the method further comprising:
forming an anti-oxidation barrier material, wherein the insulating layer is formed on the anti-oxidation barrier material;
etching the anti-oxidation barrier material so as to form an anti-oxidation barrier having a second opening, wherein the second opening has the second width; and
removing the spacer.

11. The manufacturing method according to claim 10, further comprising forming a bottom electrode, wherein the insulating layer is formed on.

12. The manufacturing method according to claim 11, further comprising oxidizing the bottom electrode prior to the step (b).

13. The manufacturing method according to claim 11, wherein the step (c) further comprises oxidizing the bottom electrode so as to form an oxide layer having the memory cell positioned therein.

* * * * *